United States Patent

Kitaguchi et al.

[15] 3,644,924

[45] Feb. 22, 1972

[54] ANALOG-TO-DIGITAL CONVERTER

[72] Inventors: Tome Kitaguchi, Silver Spring, Md.; Herman L. Renger, Calabasas, Calif.

[73] Assignee: The Bunker-Ramo Corporation, Oak Brook, Ill.

[22] Filed: Dec. 17, 1969

[21] Appl. No.: 885,836

[52] U.S. Cl. ....................340/347 AD

[51] Int. Cl. ....................H03k 13/02

[58] Field of Search ....................340/347; 235/154; 332/11

[56] References Cited

UNITED STATES PATENTS

| | | | |
|---|---|---|---|
| 3,501,625 | 3/1970 | Gorbatenko | 235/154 |
| 3,216,005 | 11/1965 | Hoffman et al. | 340/347 |
| 2,922,151 | 1/1960 | Reiling | 340/347 |
| 3,384,889 | 5/1968 | Lucas | 340/347 |
| 2,730,676 | 1/1956 | Barker | 332/11 |
| 3,329,950 | 7/1967 | Shafer | 340/347 |

*Primary Examiner*—Maynard R. Wilbur
*Assistant Examiner*—Charles D. Miller
*Attorney*—Frederick M. Arbuckle

[57] ABSTRACT

A converter responsive to analog input signals for providing "reflected binary" or Gray code output signals. The converter is comprised of a plurality of stages of essentially two types; i.e., serial-type stages and parallel-type stages. Each serial-type stage responds to an input signal applied thereto to yield both a bit output signal and a residual analog output signal. Two or more serial-type stages are connected in cascade with the residual analog output signal developed by each stage being applied as the analog input signal to a succeeding stage. The last cascaded stage provides its residual analog output signal in parallel to a plurality of parallel-type stages. Each parallel-type stage provides a bit output signal and is comprised of one or more differential comparators, each of which compares the level of the analog input signal applied thereto with a different decision level.

6 Claims, 5 Drawing Figures

INVENTORS
TOME KITAGUCHI
HERMAN L. RENGER
BY Lindenberg & Freilich
ATTORNEYS

Patented Feb. 22, 1972 3,644,924

2 Sheets-Sheet 2

INVENTORS
TOME KITAGUCHI
HERMAN L. RENGER
BY Lindenberg & Freilich
ATTORNEYS

ANALOG-TO-DIGITAL CONVERTER

BACKGROUND OF THE INVENTION

This invention relates generally to analog-to-digital converters and more particularly to an improved converter responsive to analog input signals for providing "reflected binary" or Gray code digital output signals.

U.S. Pat. No. 3,187,325 discloses a converter for converting analog input signals to Gray code digital output signals. A significant characteristic of the Gray code is that no two successive codes differ by more than a single digit. The converter disclosed by the patent employs a plurality of stages with each stage forming a bit output signal and residual analog output signal. The residual analog output signal is developed as a consequence of the stage exhibiting a V-shaped transfer characteristic between the analog input signal applied thereto and the analog output signal provided thereby. The stages are connected in cascade with the residual analog output signal from each stage being applied as the analog input to a succeeding stage.

U.S. Pat. application, Ser. No. 645,191, now U.S. Pat. No. 3,577,139 entitled "Analog-to-Digital Converter," filed by Roy P. Foerster on June 1967, and assigned to the same assignee as the present application, discloses an improved converter stage which also provides bit and residual analog output signals and which is also intended to be connected in cascade with a plurality of identical stages to convert an analog input signal to a Gray code output.

In the converters disclosed by both the aforecited patent and patent application, it is important that the residual analog output signal developed by each stage be very precise because any errors therein will be propagated through succeeding states. As a consequence, such stages are usually formed of very high quality operational amplifiers and precision resistors to assure a fast accurate response.

SUMMARY OF THE INVENTION

In accordance with the present invention, faster overall conversion response times are achieved by providing a converter comprised of a first group of serial-type stages connected in cascade with the residual analog output signal of the last serial-type stage driving, in parallel, a second group of parallel-type stages. For example, in a preferred embodiment of the invention for converting an input analog signal to 10 Gray code bits, six serial-type stages can be connected in cascade with the residual analog output signal from the sixth stage driving four parallel type stages.

In accordance with a further aspect of the present invention, it is recognized that inasmuch as converter stages driven in parallel need not develop a residual analog output signal, a few such stages can be implemented more simply and at a lower cost than the same number of serial-type stages while still allowing a converter comprised of both such parallel and serial-type stages to exhibit a faster overall response than a converter comprised solely of serial-type stages.

In a preferred embodiment of the present invention, each of the parallel type stages in comprised of one or more differential comparators, each of which compares the level of an analog input signal with a different decision level to arrive at a bit decision. For example, if the range of an analog input signal is 0 to a +8 volts, the most significant bit decision depends upon whether the analog input signal level is greater or less than +4 volts. This decision is made by applying a +4 volt reference level to the base of one transistor of a comparator differential pair and the analog input signal to the base of the other transistor of the pair.

Figure 1:
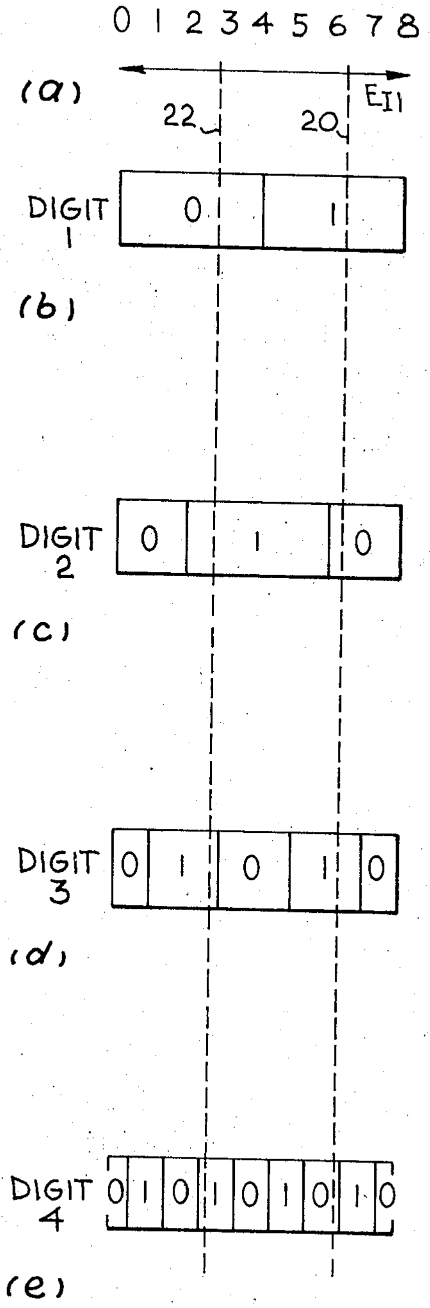
FIG. 1 comprises a diagram illustrating the Gray code representation of an analog quantity.

Attention is now called to FIG. 1 which illustrates the manner in which a four digit reflected binary code group can represent various levels of an analog signal. Note that line (*a*) of FIG. 1 represents an analog input signal $E_{I1}$ whose level will be assumed to lie in a range between 0 and 8 units (e.g., volts). Lines (*b*), (*c*), (*d*), and (*e*) of FIG. 1 respectively define the states of the four digits of a reflected binary code group for any value of input signal. It should be appreciated that utilization of four digits enables the range of the input signal $E_{I1}$ to be quantized into 16 different levels, each level being represented by a different code group. In order to determine the reflected binary code group representative of any level of input signal $E_{I1}$, it is merely necessary to locate that level on line (*a*), and sight down the diagram, reading off the four digits in lines (*b*), (*c*), (*d*), (*e*). For example, consider that the input signal $E_{I1}$ defines a level 6.2 on the indicated scale 0–8. By sighting down FIG. 1 along the dashed line 20, it will be apparent that the analog level 6.2 will be represented by the reflected binary code 1010. As a further example, an analog input signal having a level 2.8 will be represented by the reflected binary code group 0111 as indicated by dashed line 22.

Figure 3:
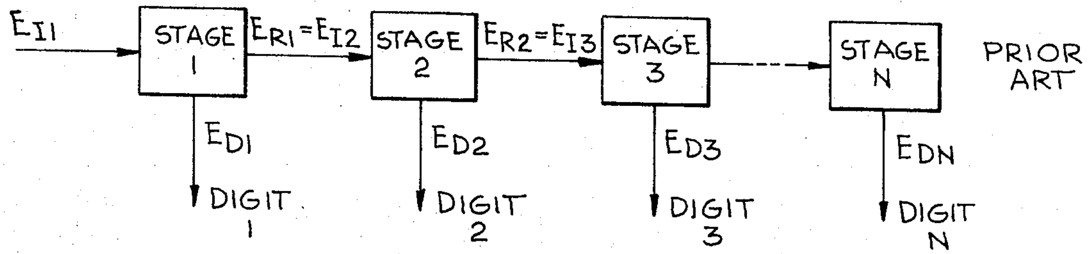
FIG. 3 is a block diagram illustrating a completely serial-type converter in accordance with the prior art.

Both the aforecited patent and patent application disclose an apparatus capable of converting an analog input signal as represented by line (*a*) of FIG. 1 to a corresponding set of reflected binary digits. As taught therein, in order to convert an analog signal level into a reflected binary code group, a plurality of substantially identical stages (stage 1, stage 2, stage 3, and stage 4) can be connected in cascade as shown in FIG. 3. Each of the stages typified by block 24 is provided with an analog input terminal 26, a digit signal output terminal 28, and a residual analog signal output terminal 30. The analog signal $E_{I1}$ to be converted is applied to the input terminal 26 of the first stage. The output terminal 30 of each stage is connected to the input terminal 26 of a subsequent stage. Thus, the residual analog output signal developed by each stage is applied as the analog input signal to a succeeding stage. The residual analog output signal developed by stage 1 is designated $E_{R1}$. The digital output signal developed by stage 1 on terminal 28 is designated as $E_{D1}$.

Figure 2:
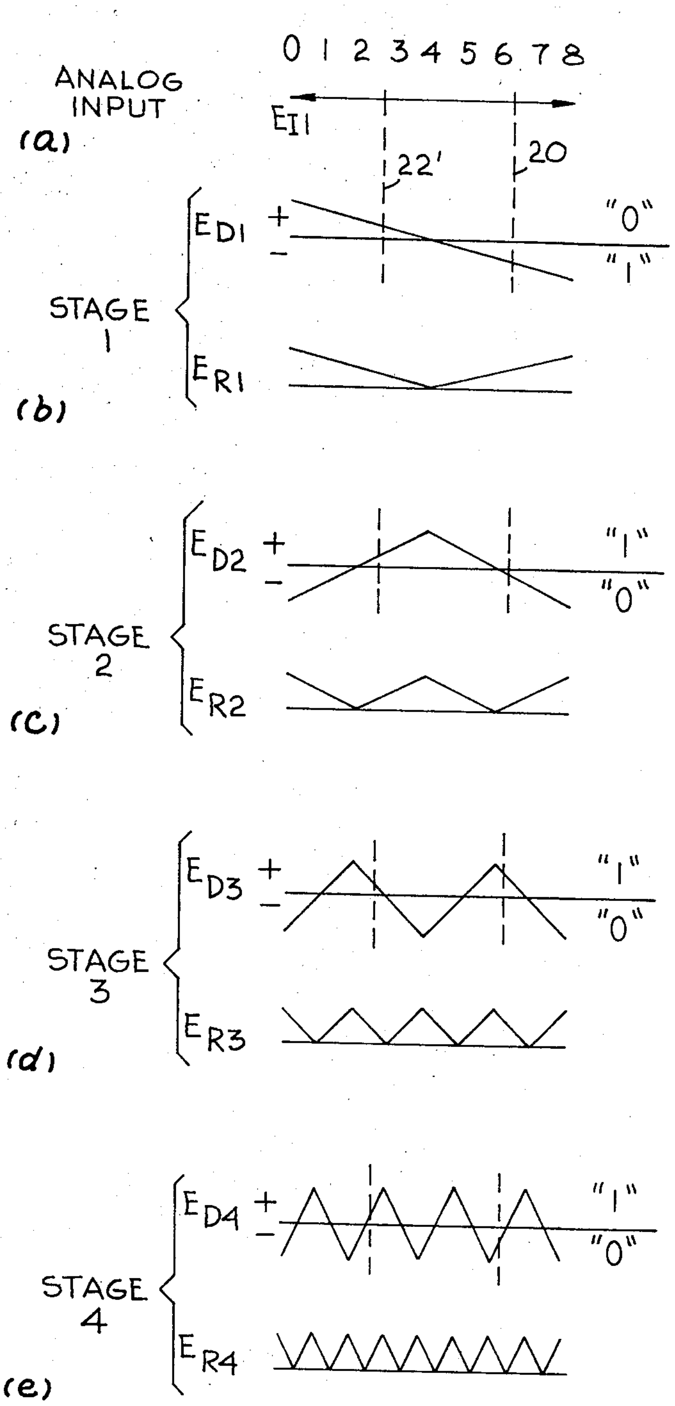
FIG. 2 comprises a diagram similar to FIG. 1 illustrating serial stage transfer characteristics for developing digital output and residual output signals for converting an analog input signal to a reflected binary code.

FIG. 2 demonstrates how the prior art converter of FIG. 3 functions to convert analog input signal levels to reflected binary code signals. Line (*a*) of FIG. 2 is identical to line (*a*) of FIG. 1 and represents the analog input signal range. Line (*b*) of FIG. 2 illustrates the transfer characteristics of stage 1 showing the valves of the digit output and residual output signals $E_{D1}$ and $E_{R1}$ for the various levels of analog input signals. Line (*c*) of FIG. 2 illustrates the transfer characteristics of stage 2 of FIG. 3 showing the values of signals $E_{D2}$ and $E_{R1}$ produced by stage 2 in response to the application of signal $E_{R1}$ thereto. Similarly, lines (*d*) and (*e*) of FIG. 2 respectively illustrate the transfer characteristics of stages 3 and 4 of FIG. 3.

It will be noted that the digit signal characteristics illustrated in lines (*b*), (*c*), (*d*), and (*e*) of FIG. 2 define crossover points corresponding to the stage changes in the diagram of FIG. 1. Thus, in line (*b*) of FIG. 2, for example, the signal $E_{I1}$ is positive for the first half of the range of input signal $E_{I1}$ and is negative for the second half of the input signal range. This corresponds to digit 1 represented in FIG. 1 as constituting a "0" for the first half of the input signal range and constituting a "1" for the second half of the input signal range. Note that for signal $E_{D1}$ a positive polarity represents a binary ")" and a negative polarity represents a binary "1." For subsequent stages, a positive value of the digit signal represents a binary "/" and negative values represent a binary "0." For example, note line (*c*) of FIG. 2 in which the signal $E_{D2}$ is negative for the first and last quarters of the input signal range and positive therebetween. This corresponds to digit 2 in FIG. 1 which is "0" for the first and last quarters of the input signal range and "1" therebetween.

FIG. 2 illustrates by dotted lines 20' and 22' the conversion of input signal levels 6.2 and 2.8 respectively represented by the dotted lines of 20 and 22 in FIG. 1. Note that for the value 6.2 represented by dotted line 20', the stages 1–4 of FIG. 3 will respectively provide the digits 1010 which correspond to the code group indicated for this input signal value indicated in FIG. 1. Similarly, the input signal level 2.8 will cause stages 1–4 of FIG. 3 to respectively provide binary signals 0111 which correspond to the representation indicated in FIG. 1.

From what has been said thus far, it should now be appreciated that by defining the transfer characteristics shown in FIG. 2, the prior art converter of FIG. 3 will provide reflected binary code signals in response to an input analog signal. It should be realized that the transfer characteristics represented in FIG. 2 are identical for all of the stages. More particularly, it will be noted that stage 1, for example, responds to the range of input signal $E_{I1}$ to provide an output signal $E_{D1}$ having a range which intersects 0 or ground potential at the midpoint of the input signal range. It can be assumed, for example, that the range of input signal $E_{I1}$ is 0 to 8 volts. The signal $E_{D1}$ can have a range which extends, for example, from +8 volts to −8 volts. Thus, when the input signal $E_{I1}$ defines a level of +4 volts, the signal $E_{D1}$ will be at ground potential. The residual signal $E_{R1}$ can be considered as constituting the signal $E_{D1}$ except that the negative half of the range of signal $E_{D1}$ is inverted. Thus, for example, signal $E_{R1}$ can have a range from 0 to +8 volts. When the signal $E_{D1}$ is at either +8 or −8 volts, the signal $E_{R1}$ will be at +8 volts. When the signal $E_{D1}$ is at ground potential, the signal $E_{R1}$ will be at ground potential.

It should be appreciated that stage 1 of FIG. 3 must define a V-shaped transfer characteristic in order to provide the signal $E_{R1}$ shown in FIG. 2 in response to the input signal $E_{I1}$. The V-shaped characteristic must be symmetrical about the midpoint of the input signal range. Stages 2, 3 and 4 can be identical to stage 1 and define the same characteristic. Thus, stage 2 will provide signal $E_{D2}$ from signal $E_{R1}$ by inverting signal $E_{R1}$ amplifying it, and increasing its midpoint to some positive level, e.g., +8 volts.

In order for the prior art converter of FIG. 3 to operate rapidly and accurately, each of the identical stages is formed of very high quality operational amplifiers and precision resistors. In accordance with the present invention, it is recognized that inasmuch as converter stages driven in parallel need not develop a residual analog output signal, a few such stages can be implemented more simply and at a lower cost than the same number of serial-type stages while still allowing a converter comprised of both such parallel and serial type stages to exhibit a faster overall response than a converter comprised solely of serial-type stages.

Figures 4, 5:
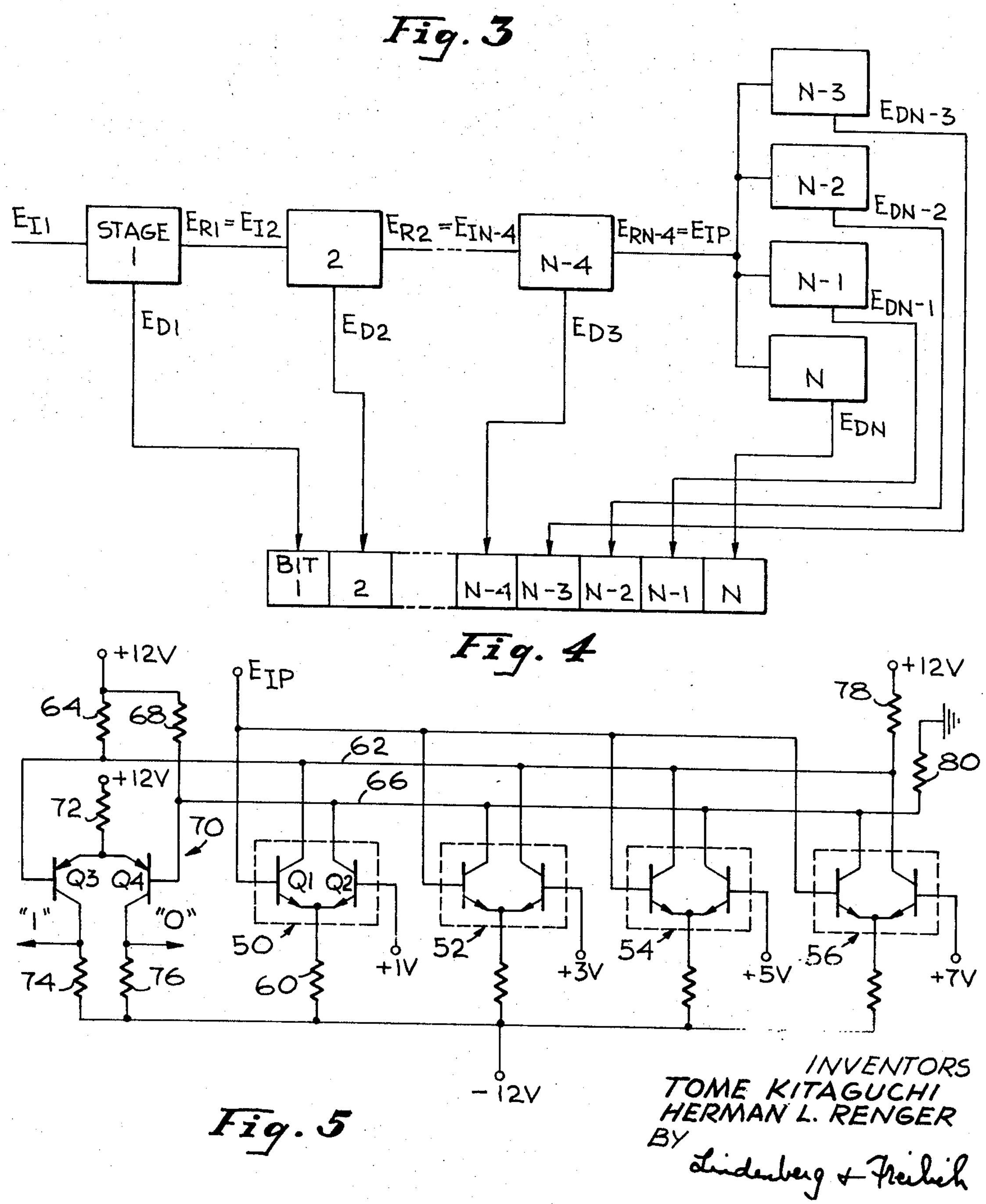
FIG. 4 is a block diagram of an analog-to-digital converter in accordance with the present invention utilizing both serial and parallel-type converter stages.
FIG. 5 is a schematic diagram of a parallel-type stage typical of those employed in the embodiment of FIG. 4.

More particularly, attention is now called to FIG. 4 which illustrates an embodiment of the present invention employing both serial-type stages 34 and parallel-type stages 36. Assume it is desired to convert an analog input signal to a Gray code output having an N bit resolution. In accordance with the present invention, the last few bits e.g., N−3, N−2, N−1, N) are derived from stages which operate in parallel on the residual analog output signal provided by the last cascaded stage N−4. Because the four stages (N−3, N−2, N−1, N) are operating in parallel, as long as they have a speed greater than one-fourth the speed of the serial-type stages 34, the embodiment of FIG. 4 will yield an overall net speed advantage over the embodiment of FIG. 3. In addition to yielding a speed advantage, a limited number of parallel-type stages e.g., four) can be implemented less expensively than the same number of series-type stages because they need not be as accurate as the series stages since they are not called upon to develop a residual signal for further processing. As will be seen hereinafter, the number of parallel-type stages which can as a practical matter be utilized, is limited because the complexity of each parallel-type stage is almost double that of the preceding parallel-type stage. That is, the initial parallel stage N−3 is called upon to compare the analog input $E_{IP}$ to the parallel stages with only one decision level. The next parallel stage N−2, however, must compare the signal $E_{IP}$ with two decision levels; stage N−1 must compare signal $E_{IP}$ with four decision levels and stage N must compare the signal $E_{IP}$ with eight decision levels.

If it is assumed for the sake of convenience that the residual analog output signal $E_{IP}$ from the last cascaded stage N−4 has been normalized so that it lies within the range of 0 to 8 units, then from FIG. 1, it can be seen that the parallel-type stages 36 must define the following decision levels:

| Stage | Decision levels |
|---|---|
| N−3 | 4 |
| N−2 | 2,6 |
| N−1 | 1, 3, 5, 7, |
| N | ½, 1−½, 2−½, 3−½, 4−½, 5−½, 6−½, 7−½ |

If the signal $E_{IP}$ has a level 2.8, for example, then from FIG. 1, it will be clear that the parallel stages N−3, N−2, N−1, and N will respectively provide binary output digits 0, 1, 1, 1. If the signal $E_{IP}$ has a level of 6.2, then the stages N−3, N−2, N−1, and N will respectively provide binary digits 1, 0, 1, 0. As shown in FIG. 4, the digit output terminals of all the stages, both serial type and parallel type, are coupled to the appropriate stages of an output register 40.

A preferred embodiment of the parallel type stage 36, N−1, is illustrated in FIG. 5. It will be recognized that the other parallel type stages will differ from the stage illustrated in FIG. 5 only in that a different number of differential comparators will be employed. Stage N−1 of FIG. 5 employs four differential comparators 50, 52, 54 and 56, each of which defines a different decision level for comparison with the input signal $E_{IP}$. Each of the differential comparators is comprised of first and second transistors Q1 and Q2, illustrated as comprising N PN-transistors. The emitters of the transistors Q1 and Q2 are connected in common and through a resistor 60 to the source of negative potential, herein illustrated as −12 volts. The collector of transistor Q1 of differential comparator 50 is connected to buss 62 which in turn is connected through resistor 64 to a source of positive potential, herein illustrated as +12 volts. The collector of transistor Q2 of differential comparator 60 is connected to buss 66 which in turn is connected through resistor 68 to the +12 volt potential. For purposes of balance, as will be seen hereinafter, the connections between the differential comparators and the busses 62 and 66 are alternated. That is, note that the collectors of differential comparators 52 and 56 are connected to the busses 62 and 66 in a manner opposite to the manner in which the collectors of differential comparator 50 are connected to the busses. Differential comparator 54 is connected in the same manner as differential comparator 50.

The bases of all the transistors Q1 are connected to receive the input signal $E_{IP}$. As will be recalled from FIG. 4, the input signal $E_{IP}$ to the parallel stages constitutes the residual analog output signal developed by the last cascaded stage N−4. The bases of transistors Q2 of the differential comparators are respectively connected to voltage reference levels equal to the decision levels to be defined by the stage. Thus, in FIG. 5, the base of transistor Q2 of differential comparator 50 is connected to a source of +1 volt. Similarly, the bases of transistors Q2 of differential comparators 52, 54 and 56 are respectively connected to sources of potential equal to +3 volts, +5 volts, and +7 volts. Note that these levels agree with the decision levels indicated in the aforesetforth table and in FIG. 1.

As should be apparent, when the level of input signal $E_{IP}$ is less than +1 volt, the transistors Q2 of all the differential comparators 50, 52, 54 and 56 will be conducting and all the transistors Q1 will be off. When the level of signal $E_{IP}$ exceeds +1 volt, then the transistor Q1 of differential comparator 50 will begin to conduct. As the level of $E_{IP}$ increases to beyond +3 volts, transistor Q1 of differential comparator 52 will begin to conduct. Similarly, as the level of signal $E_{IP}$ increases to beyond +5 volts, transistor Q1 of differential comparator 54 will conduct and as it exceeds +7 volts, transistor Q1 of differential comparator 56 will conduct. It will be recognized of course that when one of the transistors Q1 conducts, the transistor Q2 connected thereto will be biased off.

A master differential comparator 70 is provided to determine the level of the input signal $E_{IP}$ by monitoring the currents to the comparators 50, 52, 54 and 56. More particularly, the comparator 70 is comprised of transistors Q3 and Q4 which are illustrated as constituting PNP transistors. The emitters of transistors Q3 and Q4 are connected in common and through a resistor 72 to a source of positive potential, illustrated as +12 volts. The bases of transistors Q3 and Q4 are respectively connected to transistors 64 and 68. The collectors of transistors Q3 and Q4 are respectively connected through resistors 74 and 76 to the −12 volt potential.

Off-balance biasing means are provided to off-balance the currents in busses 62 and 66 when the input signal $E_{IP}$ does not exceed any of the decision levels. Thus, buss 62 is connected through resistor 78 to a source of +12 volt potential and buss 66 is connected through resistor 80 to ground.

In operation, assume that the level of the input signal $E_{IP}$ is less than +1 volt. As a consequence transistors Q2 of differential comparators 50 and 54 will pull current from the +12 volt source through resistor 68 while transistors Q2 of differential comparators 52 and 56 will pull an equal current from the +12 volt source through resistor 64. In the absence of the off-balance biasing resistors 78 and 80, the bases of transistors Q3 and Q4 of the master comparator 70 will see essentially the same signal. However, note that due to the inclusion of the off-balance biasing resistors 78 and 80, resistor 80 will effectively draw current away from the base emitter junction of the PNP-transistor Q4 thus tending to forward bias it, while resistor 78 will provide current to the base of transistor Q3 thus tending to off-bias it. Thus, with the input signal $E_{IP}$ at a level less than +1 volt, transistor Q4 will be forward biased and transistor Q3 will be off. Thus, an output terminal connected to the collector of transistor Q4 will be at a relatively high potential, e.g., ground to represent an output digit "0." The collector of transistor Q3 will be approximately −12 volts.

When the input signal $E_{IP}$ increases to above +1 volt, transistor Q1 of differential comparator 50 will become forward biased and transistor Q2 of the same differential comparator will turn off. As a consequence, buss 62 will now draw a greater current through resistor 64 than is being drawn by buss 66 from resistor 68. Therefore, transistor Q3 will become forward biased and transistor Q4 will become off-biased thereby providing a "1" bit output signal at the collector of transistor Q3. Where the input signal $E_{IP}$ exceeds +3 volts, transistor Q1 of differential comparator 52 will begin to conduct to thus draw a greater current through resistor 66 than through resistor 64 to thereby forward bias transistor Q4 and off-bias transistor Q3 to in turn provide a "0" output signal.

Each of the other parallel stages N−3, N−2, and N operate identically to the stage N−1 of FIG. 5 except, of course, they define different decision levels. It should therefore be apparent that in combination, the four parallel stages 36 will, for any analog input signal, provide four bit output signals in accordance with the Gray code representation as shown in FIG. 1. Although four parallel stages have been shown, it should be apparent that a greater or lesser number of parallel stages can be employed and that they can be used in conjunction with any number of serial-type stages as shown in FIG. 4.

The embodiments of the invention in which an exclusive property or privilege is claimed are defined as follows:

1. An analog-to-digital converter for converting an analog signal into an N-bit digital output signal, comprising:

a plurality of first converter stages arranged in series and including initial and last stages and a plurality of intermediate stages, each first converter stage being responsive to an analog input signal applied thereto for providing a respective one of the most significant bits of said N-bit digital output signal, each first converter stage also providing a residual analog output signal;

means applying the residual analog output signal provided by each of said initial and intermediate first converter stages to a succeeding first converter stage;

a plurality of second converter stages to which the last first converter stage residual analog output signal is applied in parallel, each second converter stage providing a respective one of the remaining least significant bits of said N-bit digital output signal;

each of said parallel converter stages including $2^n$ differential comparators where $n$ represents the significance of the output bit to be provided by each stage, each differential comparator having first and second transistors, each transistor having an emitter, a collector, and a base;

means applying the residual analog output signal of said last first converter stage to said first transistor bases;

means applying a different reference voltage equal to a decision level to each of said second transistor bases;

means connecting the first transistor emitter-collector paths of one-half of said differential comparators and the second transistor emitter-collector paths of the other half of said differential comparators in a first current path;

means connecting the first transistor emitter-collector paths of the other half of said differential comparators and the second transistor emitter-collector paths of the first half of said differential comparators in a second current path; and means for providing the bit output signal of each stage in response to determining whether a greater current exists in said first or said second current path.

2. The analog-to-digital converter of claim 1 wherein all of said first converter stages are identical.

3. The converter of claim 1 including:

an output register having a plurality of stages; and means connecting the bit output terminals of said series and parallel stages to said output register stages.

4. The converter of claim 1 wherein each of said series stages includes means responsive to a signal applied thereto whose level lies within a predetermined range for determining whether or not said level exceeds the midpoint of said range.

5. The invention in accordance with claim 1, wherein said N-bit digital output signal is in a "reflected binary" code.

6. The invention in accordance with claim 1, wherein said last-mentioned means for providing the bit output signal of each stage includes a master differential comparator responsive to the currents in said first and second current paths.

* * * * *